(12) United States Patent
Marshall et al.

(10) Patent No.: US 7,952,378 B2
(45) Date of Patent: May 31, 2011

(54) TUNABLE STRESS TECHNIQUE FOR RELIABILITY DEGRADATION MEASUREMENT

(75) Inventors: Andrew Marshall, Dallas, TX (US); Vijay Kumar Reddy, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/358,510

(22) Filed: Jan. 23, 2009

(65) Prior Publication Data

US 2010/0164531 A1 Jul. 1, 2010

Related U.S. Application Data

(60) Provisional application No. 61/141,955, filed on Dec. 31, 2008.

(51) Int. Cl.
*G01R 31/26* (2006.01)

(52) U.S. Cl. .................................. 324/762.09

(58) Field of Classification Search ............... 324/158.1, 324/765–769, 762.09
See application file for complete search history.

(56) References Cited

U.S. PATENT DOCUMENTS

| | | | |
|---|---|---|---|
| 5,600,578 A * | 2/1997 | Fang et al. ...................... 703/14 |
| 6,587,994 B1 * | 7/2003 | Yamaji ........................... 716/115 |
| 6,724,214 B2 * | 4/2004 | Manna et al. .................. 324/766 |
| 6,815,970 B2 * | 11/2004 | Rost et al. ...................... 324/765 |
| 6,873,173 B2 * | 3/2005 | Kollmer et al. ............ 324/750.16 |
| 7,583,087 B2 * | 9/2009 | Pilling et al. ................... 324/522 |

* cited by examiner

*Primary Examiner* — Ha Tran T Nguyen
*Assistant Examiner* — Joshua Benitez
(74) *Attorney, Agent, or Firm* — Warren L. Franz; Wade J. Brady, III; Frederick J. Telecky, Jr (57) ABSTRACT

Apparatus and methods are disclosed for examining how reliability in an RF power amplifier circuit changes as a function of variation of the input to output voltage swings. Two output transistors that varying greatly in the size of their respective channel widths are provided for independently evaluating impacts on the output waveform. The gate control for the smaller transistor is separate from the gate control to the larger transistor. The gate and drain stress can thus be adjusted and evaluated independently.

15 Claims, 6 Drawing Sheets

TUNABLE STRESS TECHNIQUE FOR RELIABILITY DEGRADATION MEASUREMENT

CROSS-REFERENCE TO RELATED APPLICATIONS

This application claims priority to U.S. Provisional Patent Application Ser. No. 61/141,955 filed Dec. 31, 2008, entitled, "Tunable Stress Technique for Reliability Degradation Measurement".

FIELD

The present invention relates generally to the field of integrated circuit processing, and more particularly to devices and methods for determining reliability limitations of a transistor device.

BACKGROUND

The continual demand for enhanced integrated circuit performance has resulted in, among other things, a dramatic reduction of semiconductor device geometries, and continual efforts to optimize the performance of every substructure within any semiconductor device. A number of improvements and innovations in fabrication processes, material composition, and layout of the active circuit levels of a semiconductor device have resulted in very high-density circuit designs. Increasingly dense circuit design has not only improved a number of performance characteristics, it has also increased the importance of, and attention to, semiconductor material properties and behaviors.

Through use, the operation of a transistor may degrade over time. There are currently several known modes of transistor degradation. One type of degradation mechanism involves channel hot carriers (CHC) and hot carrier injection (HCI). In general, an excessively high electric field within a transistor causes degradation, usually in the gate oxide. One type of degradation mechanism is referred to as off-state band-to-band tunneling induced hot-carrier degradation. In this type of degradation the most significant degradation can occur when the transistor is in the off-state (i.e., when the gate voltage is below Vt and the transistor is not conducting current).

Commonly device manufacturers specify or define a number of boundary device design parameters (e.g., max/min voltage, max/min current) within which a desired device reliability level may be achieved, or even guaranteed. For example, a semiconductor device may be guaranteed an operational life of 10 years if its supply voltage is maintained at or below 5 Volts over that life. Often, such specifications are derived from a number of characterization tests and simulations performed on sample devices or device structures.

In addition, many end equipment applications demand a guaranteed operational lifetime for a device operating at some fixed set or range of operating conditions. Where a semiconductor manufacturer is supplying devices utilizing a mature fabrication technology, a certain amount of historical data on the actual performance or degradation of the devices over some given lifetime may be available. Frequently, however, the manufacturer is producing the devices utilizing a new, state-of-the-art fabrication technology. In many cases, such technologies have not been in existence long enough to have actual lifetime performance or degradation data compiled. The device manufacturer must, nonetheless, determine some operational device lifetime that it will guarantee.

Manufacturers thus commonly rely on accelerated stress testing of sample device structures or devices. Such structures are dynamically stressed to levels far above their intended operating conditions, and data on critical operational or behavioral parameters at those dynamic stress levels is compiled. That data can then be evaluated to develop characterizations or profiles of the device technology, from which the manufacturer may extrapolate to provide some guaranteed lifetime at normal operating conditions.

Unfortunately however, the ability of a manufacturer to accurately characterize certain device operational or behavioral parameters independently has been somewhat limited by conventional characterization methodologies. Depending upon the manufacturing technology and upon the particular device structures being characterized, conventional characterization schemes may limit a manufacturer's ability to vary certain parameters independently during stress testing. As a result, characterizations of two or more parameters are often interdependent. Certain assumptions must then be made regarding the behavior of those parameters with respect to one another in order to evaluate and extrapolate characterization data. In a number of cases, those assumptions introduce a certain margin of error into characterization data. This margin of error can result in, for example, an overestimation or underestimation of the operational lifetime of a production device. Either situation is undesirable, subjecting either the device or end equipment manufacturer to unnecessary system failures or yield losses.

As a result, there is a need for a dynamic stress characterization system that effectively and accurately assesses degradation parameters independently—decoupling variances in operational or behavioral parametric values from one another and providing optimal device characterization in an easy, efficient and cost-effective manner.

SUMMARY

The following presents a simplified summary in order to provide a basic understanding of one or more aspects of the disclosure. This summary is not an extensive overview, and is neither intended to identify key or critical elements, nor to delineate the scope thereof. Rather, the primary purpose of the summary is to present some concepts in a simplified form as a prelude to the more detailed description that is presented later.

In one embodiment, a method is disclosed to evaluate optimum power transistor switching characteristics for determining reliability limitations. The method comprises examining operating characteristics of a first transistor in a circuit generating an output waveform, and coupling a second transistor comprising a gate terminal to the first transistor. The method further comprises applying a variable signal to the second transistor, and adjusting a stress to the gate terminal of the second transistor independent of the first transistor without altering any operating characteristics of the first transistor.

In another embodiment, a circuit to modify stress characteristics in RF circuitry for determining reliability variation as a function of gate to drain voltage and generate an output waveform is disclosed. The circuit comprises a plurality of output transistors comprising a first transistor and a second transistor. The first transistor is coupled to the second transistor, and a capacitor and an inductor coupled to the first transistor. The circuit further comprises a first switchable inverter coupled to a gate terminal of the first transistor, and a second switchable inverter coupled to a gate terminal of the second transistor and to the first switchable inverter. The second switchable inverter comprises a switch coupled to a transmission gate for generating a variable signal, and an adjusting control configured to vary timing offsets of the variable signal and allow degradation to be measured.

The following description and annexed drawings set forth in detail certain illustrative aspects and implementations of the invention. These are indicative of but a few of the various ways in which the principles of the invention may be employed.

DETAILED DESCRIPTION

While the making and using of various embodiments are discussed in detail below, it should be appreciated that the present disclosure provides many applicable concepts, which can be embodied in a wide variety of specific contexts. The present disclosure is hereafter illustratively described in conjunction with stress testing of transistor structures for the development of semiconductor process characterization or design rules. One or more embodiments of the present disclosure will now be described with reference to the attached drawings, wherein like reference numerals are used to refer to like elements throughout, and wherein the illustrated structures are not necessarily drawn to scale.

The present disclosure provides a versatile system, comprising a number of apparatus and methods, for decoupling variances in operational or behavioral parametric values during stress characterization. As described briefly hereinafter, complications can arise from parametric interdependencies inherent in many conventional characterization or test schemes. These interdependencies can result in subtle, if not greater, inaccuracies in extrapolations based on compiled characterization or test data. The system of the present invention effectively obviates such interdependencies, providing an accurate assessment of stress testing parameters.

For purposes of explanation and illustration, it is useful to understand certain aspects of an illustrative device characterization application, and some of the aforementioned issues that arise therein. Consider, for example, the formation of transistor structures utilizing CMOS processes, and the design libraries that must be specified for use with such processes. Among the most prevalent degradation mechanisms having a substantial impact on long-term device reliability are channel hot carrier (CHC) effects. This is especially true in deep submicron CMOS technologies, where transistor geometries—especially gate oxide thicknesses—are continually shrinking to achieve higher performance.

Operation of such device structures can generate very high electric fields (e.g., ~1.2 MV/cm) within certain device regions. As current flows from, for example, the source region of a transistor to the gate region, current carriers (i.e., electrons) passing through high electric fields within the substrate take on energy from the field(s). The highly energized (hot) carriers then proceed to and through a transistor's relatively thin and fragile gate oxide structure. With enough energy, the hot carriers can compromise or even destroy the gate oxide, or its interface to surrounding structures (e.g., the channel structure)), degrading the integrity and performance of the transistor. Weaker transistors with slower switching characteristics, and of questionable reliability typically result.

This causes a number of problems when a device manufacturer is attempting to determine or specify operational conditions and lifetime of a device technology utilizing such a transistor. In attempts to address this, manufacturers must be able to quantify and qualify such degradation mechanisms and their effects in order to properly develop design and operation specifications for the technology.

In conventional methodologies, dynamic CHC transistor degradation models for reliability design rules can be generated utilizing CMOS ring oscillator (RO) circuitry. These RO circuits can comprise a number of inverter stages. Inverters can be used since they are one of the simplest transistor structures that can be formed having both CMOS technology types (i.e., NMOS and PMOS) in a single structure. Furthermore, in many cases, inverters comprise transistors—the very structure(s) that a manufacturer is interested in characterizing or modeling.

Inverter-based ROs self-generate a periodic input signal (e.g., a square wave), and output the periodic signal. Hot carrier damage, if any, can occur when the transistors in an RO are switching between states, due to the substrate current (i.e., high fields) generated during the transition period, or NBTI (Negative bias temperature instability) as an on-state DC stress on PMOS devices.

For a power amplifier (PA), such as the PA NMOS transistor, the most significant degradation can occur either during switching or when the transistor is in the off-state (i.e., the gate voltage Vg is below the threshold voltage Vt, and the transistor is not conducting current). This degradation is due to off-state band-to-band tunneling induced hot-carrier degradation. However, what is not understood is how small Vg to Vd timing offset changes affect overall degradation of the device.

Without the aid of the present invention, most conventional characterization systems provide for control of a single parametric variable—the stress voltage supply ($V_{DDstress}$). Using tunable stress techniques and apparatus for reliability degradation measurements, degradation from stress conditions from Vg/Vd timing offset changes are examined, and then extrapolated back to normal operating conditions to determine a normal transistor operational life for a given set of operating conditions.

Unfortunately however, conventional characterization systems without the aid of the present invention often overlook operational variances that occur in response to the variances in Vg/Vd timing offsets. Without its own independent control or stabilization, however, reliability changes as a function of variation of the input to output voltage swings cannot be evaluated independently. Thus, measurement of transistor degradation (such as in RF power amplifier circuits) becomes, for characterization purposes, a variable that must be treated as a constant. As a result, evaluations or extrapolations to determine transistor operational lifetime can be substantially overestimated or underestimated.

In contrast, the present invention recognizes the need to fully decouple the variances between the operational frequency, stress voltages, and other dynamic stress parameters in order to develop accurate and reliable characterization models and design rules. In response, the present invention provides a segregated test circuitry and methodology that effectively isolates a sample structure in such a way that particular operational or behavioral characteristics of interest may be evaluated independently.

Figure 1:
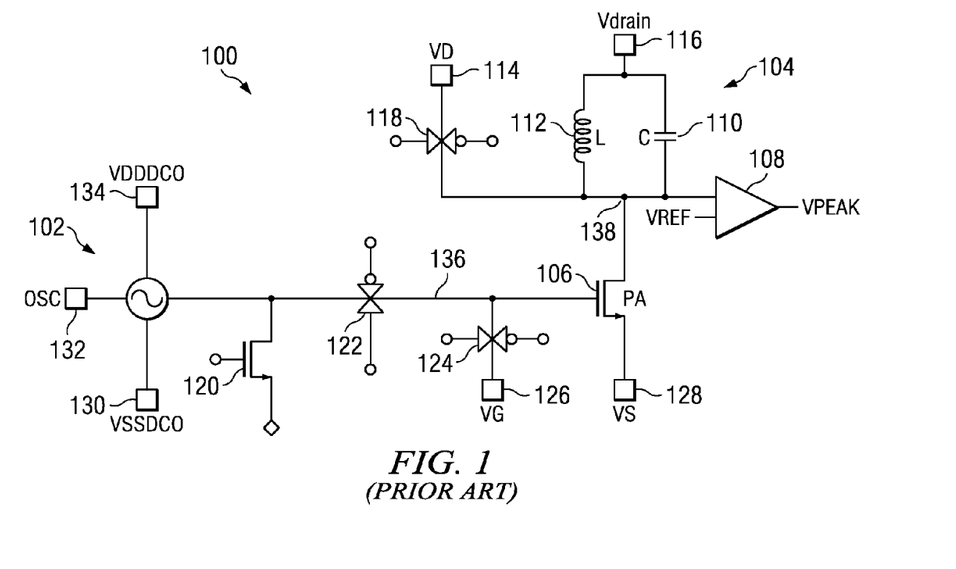
FIG. 1 illustrates a diagram of an exemplary power amplifier circuit.

Referring now to FIG. 1, is an example of a power amplifier (PA) circuit 100. The PA circuit 100 comprises a PA transistor device 106 comprising a gate terminal 136 and a drain terminal 138 on which a signal waveform is generated. This PA circuit 100 is thus operable to mimic an actual power amplifier RF operation, while not actually applying an external RF stress that would otherwise be expensive and complex. The PA circuit 100 can generate such waveforms with a DC power supply by an on-chip high frequency waveform (not shown), which is very close to the actual conditions a power amplifier may undergo.

The PA circuit 100 further comprises a digitally-controlled oscillator 102 and a resonant tank or L-C oscillator circuit 104. The digitally-controlled oscillator (DCO) 102 comprises bond pad connections VDDDCO 134, VSSDCO 130, and OSC 132. The DCO 102 is similar to a voltage-controlled oscillator driven by a control signal from a digital-to-analog converter (not shown) and is operable to simulate a range of frequencies from a timebase. Although various designs are possible, the DCO 102 of FIG. 1 is coupled to a transistor device 120 and a transmission gate 122 (e.g., a ring oscillator). The transmission gate 122 can generate an input on the gate terminal 136 of the PA transistor device 106, which comprises a bond pad connection VS 128. The gate terminal 136 of the PA device 106 comprises a bond pad connection VG 126 configured to another transmission gate 124 for generating a signal thereon.

The LC circuit 106 comprises an inductor 112, represented by the letter L, and a capacitor 110, represented by the letter C. When the capacitor 110 and inductor 112 are coupled together the LC circuit 134 is formed as a resonant tank. Consequently, an electric current can alternate between the capacitor 110 and inductor 112 at the circuit's resonant frequency. Such L-C circuits or resonant tanks can be used either for generating signals at a particular frequency, or picking out a signal at a particular frequency from a more complex signal. They can be key components in many applications such as oscillators, filters, tuners and frequency mixers. The LC circuit 134 assumes there is no dissipation of energy due to resistance, such as in an RLC circuit, which is a model that does incorporate resistance. The oscillator circuit 104 is only one model illustrated herein as an example among many that can be implemented in an RF oscillator circuit, as one of ordinary skill in the art would recognize.

FIG. 1 further illustrates the LC circuit 104 coupled to the drain terminal 138 of the transistor device 106 and comprises a bond pad Vdrain 116 as a pathway terminal. The LC circuit can be coupled in a series configuration to the drain 138 or in a parallel configuration as shown.

The LC circuit 104 resonates at a frequency that provides a reference frequency for driving operation of the PA transistor 106, such as by a waveform (e.g., square wave or similar signal). Additionally, a bond pad connection VD 114 may be configured to another transmission gate 118 coupled to the drain terminal 138. The output of the PA circuit 100 may be coupled to an amplifier 108 with a reference voltage VREF, which outputs a peak voltage signal VPEAK.

The DC characteristics of the PA transistor 106 can be relatively easy to establish. However, the reliability of the transistor (e.g., degradation characteristics) as a function of the input and output voltage swings (e.g., gate/drain voltage) can be difficult to examine because they remain dependent upon one another. The primary reason for such dependency has to do with the amount of time for the signal generated to propagate across the PA transistor 106. When switching the input to the gate terminal 136, it can take significant time (e.g., tens of picoseconds) for the signal to propagate across the transistor 106 since the PA transistor 106 can comprise a relatively large channel (not shown). Unfortunately however, a much worse stress condition can result when the input signal is delayed or enhanced even slightly. Consequently, premature failure can result in the PA transistor device 106 due to poor reliability. However, because there is no good way to adjust the input without also adjusting the output, the transistor device 106 of FIG. 1, is not optimum for determining how small Vg/Vd timing offset changes affect overall degradation for making reliability assessments.

Figure 2:
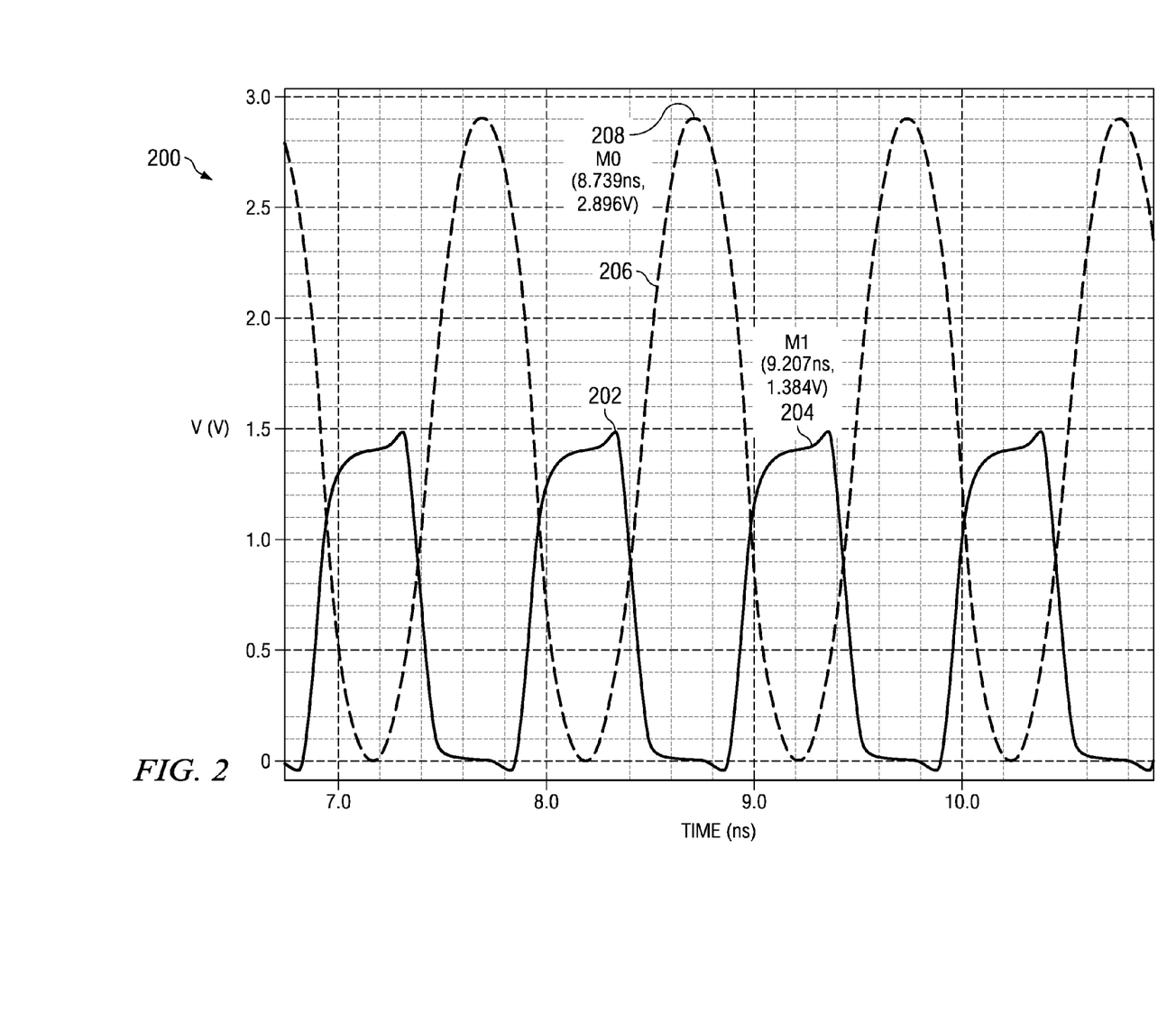
FIG. 2 illustrates a waveform chart showing gate and drain voltage waveforms of on a transistor device.

FIG. 2 illustrates a waveform chart 200 with exemplary voltage waveforms generated at the gate and drain of the PA transistor device 106 of FIG. 1. The chart 200 depicts a waveform 202 that can drive the operation of the PA transistor 106 and is generated on the gate terminal 136. The waveform 202 is similar to a square wave, although not exactly because of the speed, and has an average peak value 204 of 1.384 Volts, as illustrated at point M1 at 9.207 ns. The chart 200 further comprises a waveform 206 that is the output waveform of the PA transistor 106 of FIG. 1. Because the LC circuit 104 connects to the drain 138 of the PA transistor 106 and resonates, the frequency input to the PA transistor device 106 can be made to operate at the resonant frequency of the LC circuit's output. As shown by the waveform 206, the voltage can swing between a value 208 (e.g., about 3 Volts) at 8.730 nanoseconds (as illustrated at point M0) to nearly 0 Volts. Even though the voltage at the drain may be a constant input, the voltage can still swing because the LC circuit 104 is at resonant frequency. For example, if Vdrain is 1.5 volts, because the LC circuit 104 is resonant, the waveform may center at about 1.5 volts, but increase to nearly 3 volts and decrease to nearly 0 volts.

Variations in degradation can occur across the transistor 106 because of the timing offsets occurring between the input waveform 202 and the output waveform 206 of the transistor, for example. This can result in inaccurate reliability degradation measurements, and possibly device failure. For example, due to process variations, especially at the submicron technology, the scaling associated with production can result in a lot of variation where the signal arriving at the gate varies. Furthermore, variations in the inductor and the matching network can cause variations in the amplitude and the phase of both the drain and the gate voltages.

Figure 3:
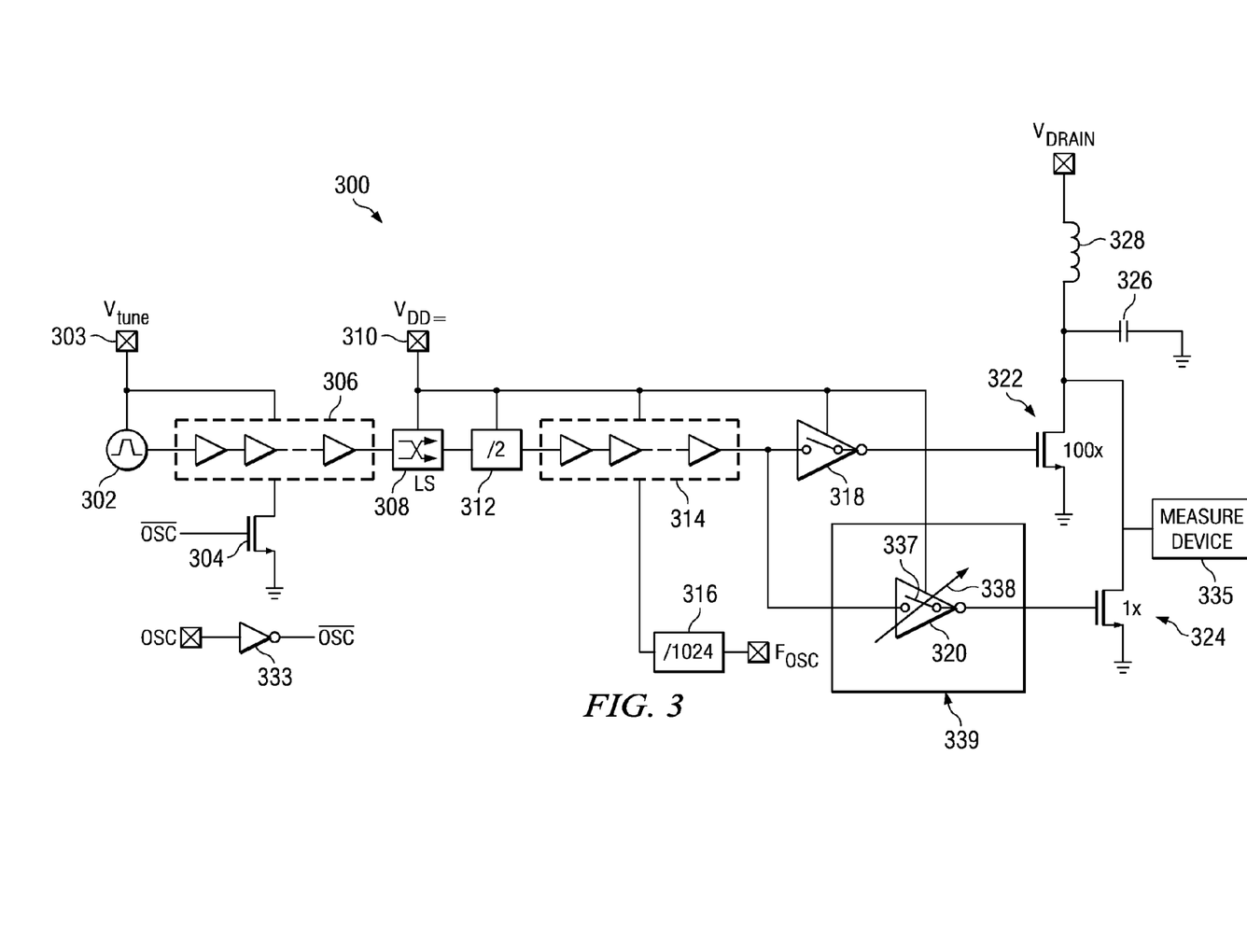
FIG. 3 illustrates an exemplary circuit for evaluating degradation of a transistor device in a power amplifier circuit.

FIG. 3 illustrates one example of a power amplifier (PA) circuit 300 that allows for degradation measurements of a PA transistor 322. The PA circuit 300 comprises an oscillator 302 coupled to a buffer 306 for generating an oscillating wave signal. A tuning voltage terminal Vtune 303 is coupled to the oscillator 302 and to the buffer 306. The buffer 306 increases the strength of the signal and can comprise a plurality of buffers increasing in size. The circuit 300 further comprises a level shifter (LS) 308 and a divide-by-two block 312 that returns the signal to a square wave. The divide-by-two block 312 can be coupled to another plurality of buffers 314 that increase in size and increase the strength of the signal even more.

The circuit 300 can further comprises a divide-by 1024 block 316. The divide by 1024 block 316 can be a simple divider (e.g., a ripple counter) that gives an output frequency, which can be easily measured. For example, it can be difficult to measure a gigahertz frequency straight from the oscillator, so a divide-by-1024 block can easily bring the signal frequency down, which later can also be multiplied by 1024 for recovering the original frequency.

The circuit 300 can comprise a switchable inverter 318 that is coupled to a 100× transistor device 322. The switchable inverter 318 can be a switchable inverter that is a standard output buffer and can be an output inverter, but alternatively could be an input inverter. The circuit 300 further comprises a switchable inverter 320 that can be a modified output buffer. The switchable inverter 320 can be coupled to a 1× transistor device 324 and proportionally sized to the 1× device 324.

The inverter 320 is a switchable component. There can be various ways to perform the switching (such as by an analog delay line), but alternatively it can comprise tap points and paired inverters (not shown), which can provide about 20 picoseconds delay of the signal and give a convenient quantization, for example. Both inverters 318 and 320 are switchable to be able to apply a DC bias to the gates of the transistors 322 and 324 during testing. In one embodiment, the inverter 320 is variable to adjust the phase or timing of the gate waveform at the 1× transistor device 324. The inverter 320 can be variable in a way that it is similar to a gate driver device that makes the signal a little faster or a little slower relative to a main gate driver.

The switchable inverters 318 and 320 operate as gate signal controls separately from one another, but are still coupled together. As a result, gate and drain stress voltages on the transistors 322 and 324 can be adjusted independently. For example, the inverter 318 can operate as a first signal control 318 coupled to a second signal control 320 (i.e., inverter 320). The second signal control or inverter 320 can comprise a signal generator 337 configured to provide a variable signal to the smaller transistor 324. For example, the inverter 320 may comprise a switching mechanism 337 coupled to a voltage Vdd 310 for generating a signal. The inverter 320 may further comprise an adjusting mechanism 338 coupled to the signal generator, and configured to adjust the signal generator and alter the variable signal to the transistor 324 without significantly affecting the output of the first transistor. The adjusting mechanism 338 can comprise delay controls 339 and/or increase controls 339 to delay or advance a characteristic of the variable signal received relative to the output of the first transistor. For example, the signal timing or phase may be delayed.

In one embodiment, the switchable inverter 318 and/or 320 can be coupled to a transmission gate 333 (OSC signal to inverter outputting an OSC bar signal). The transmission gate 333 may be replicated for both transistors 322 and/or 324, so that respective gate terminals may be coupled to a separate transmission gate. In one embodiment, the transmission gate 333 can be a variable frequency variable amplitude signal generator (e.g., ring oscillator) that is the signal generator 337 for varying a signal to the gate of transistor 324. One reason for having a transmission gate at both gates is to be able to measure respective gates and/or perform a gate voltage sweep respectively. The IDVG characteristics (e.g., drain current and gate voltage) of both transistors can be examined and degradation compared as a function of a gate voltage sweep or a fixed drain voltage.

In one embodiment, the 1× transistor device 324 can comprise a channel width that is approximately 100 times smaller than the channel width of the 100× transistor device 322 (where w/l:W/L=1:100, with 1=L, where width w=1×length l=1 L for transistor device 324 and width W=100×length L=100 L for transistor device 322). Although transistor 324 and transistor 322 may comprise the same channel length, the difference in the channel widths can be different enough so that the smaller 1× transistor device 324 does not affect the resonance frequency of the circuit 300. Even though the transistor 324 has been named a 1× transistor and the transistor 322 has been named a 100× transistor, this should not limit the device 322 to specifically being scaled 100 times the device 324. The transistor device 324 can have a different scale factor and be small enough in comparison to the transistor 322 so that it still does not significantly affect the overall resonance of the circuit 300 and can still be varied relatively easy with regard to phase or timing.

In one embodiment, the 1× transistor device 324 can be coupled to the 100× transistor device 322 in a parallel arrangement as shown in FIG. 3. A capacitor 326 can be coupled to the drain terminal of the 100× transistor 322 with an inductor 328 receiving a drain voltage Vdrain.

In one embodiment, the circuit 300 allows varying the phase of the gate voltage to drain voltage by the gate waveform on the 1× transistor device 322 across the gate terminal, and thus, controllably varying any gate to drain voltage overlapping of their respective peak voltage timing. The ability to control such overlapping can be important to determine the type of degradation occurring in the transistors 322 and 324, which can change when phase is varied. For instance, if gate and drain voltages vary greatly (e.g., 180 degrees out of phase), degradation can be determined as one type of mechanism, but when there is substantial overlapping of the gate and drain voltages at peak voltage a different type of transistor degradation mechanism can be determined. Different mechanisms of degradation can have their own time dependencies, such as voltage and temperature dependencies. By understanding the type of degradation mechanism within devices the operation characteristics and reliability limitations can be determined and modeled.

In one embodiment, the circuit 300 comprises a much smaller transistor device 324 in parallel with a relatively larger transistor device 322, which does not necessarily have to be 100 times larger, but is significantly larger so that the resonance of the circuit is not affected significantly by the smaller transistor 324. This enables measurements to be made by a measure device 335, for example, which may be coupled to the transistor 324 and/or the transistor 322 and configured to measure degradation respectively as a function of gate and/or drain voltage.

By effectively turning the PA transistor of FIG. 1 into two transistors coupled together (transistor 324 and 322 of FIG. 3), a comparison of the two transistors 324 and 322 can be made. The same bond pad connections (as in FIG. 1) remain connecting the devices, and thus, degradation can be replicated as it is affected by gate to drain voltage offset changes. While the 100× transistor 322 receives a reference waveform at its gate, the 1× transistor 324 can be advanced or delayed with respect to that reference waveform. If the transistor 324 is delayed or advanced, the phases can be examined because they are relative to one another and stress characteristics can be analyzed.

Figure 4:
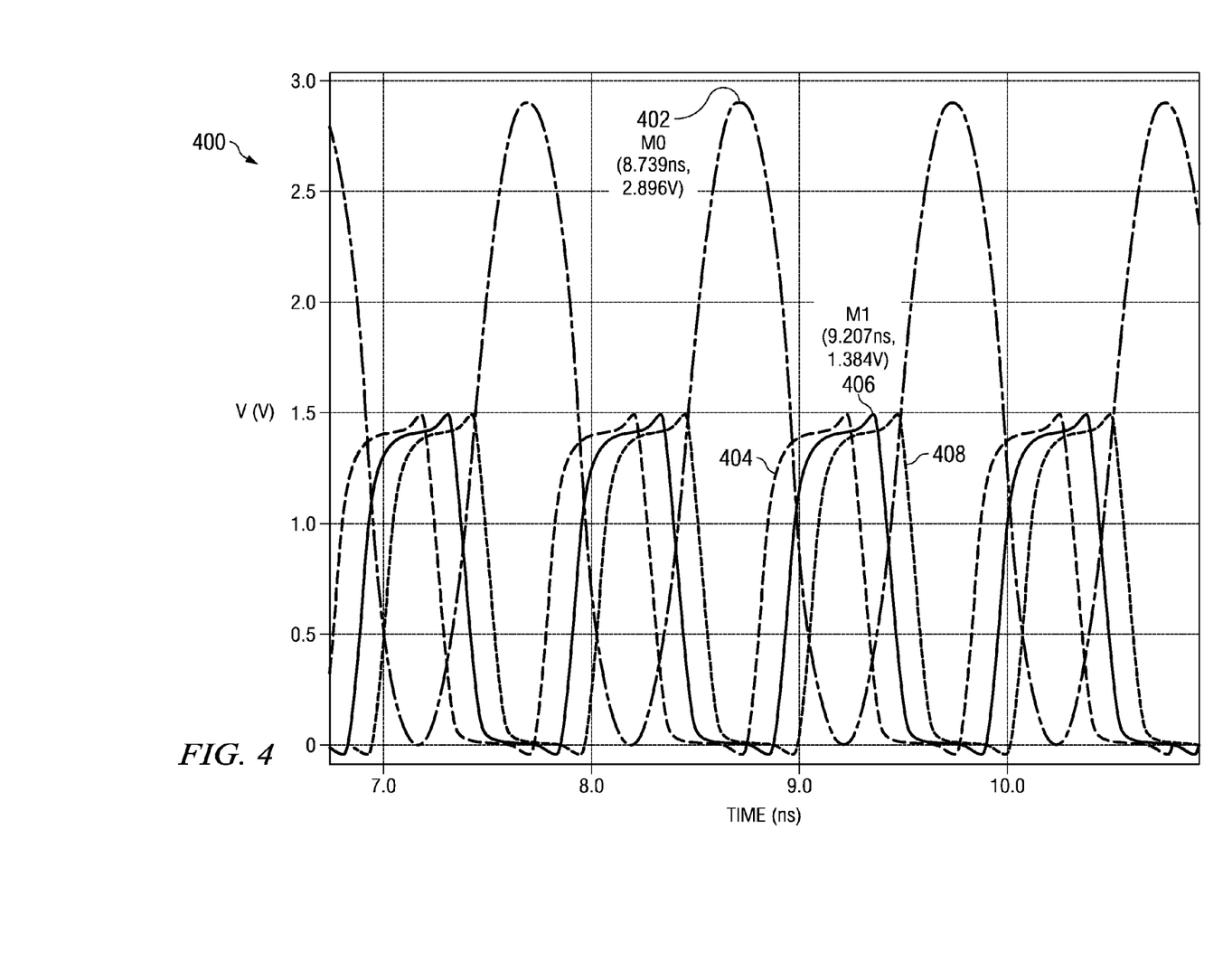
FIG. 4 illustrates a waveform chart showing gate and drain voltage waveforms of on a transistor device.

FIG. 4 illustrates a waveform chart 400 with exemplary voltage waveforms generated at the gate and drain of the transistor devices 322 and 324 in circuit 300 of FIG. 3. The chart 400 depicts various waveforms 404, 406, and 408 with different timing offsets that can drive operation of a transistor device, such as the smaller transistor device 324. The waveforms 404, 406, and 408 represent three different ways of varying the phase or timing of a signal at the gate of the transistor device. The chart 400 further comprises a waveform 402 that is the output waveform of the transistor 324. Because a resonant circuit with inductor and capacitor may connect to the drain terminal of the transistor 322 and resonate, the overall reference frequency input to the circuit 300 can operate at a resonant frequency. As shown by the waveform 402, the voltage is swinging between approximately 3 Volts at 8.730 nanoseconds (as illustrated at point MO at 8.730 ns) to nearly 0 Volts. Even though the voltage at the drain may be a constant input, the voltage will swing because the circuit is at resonant frequency.

Variations in degradation can occur across the transistor 302 because of the timing offsets occurring between the input waveforms 406, 404, and 408 and the output waveform 402 of the transistor. The various waveforms can provide a means to apply different stressing for determining types of degradation mechanisms occurring, for example, by advancing the signal at 408 or delaying the signal at 406.

Figure 5:
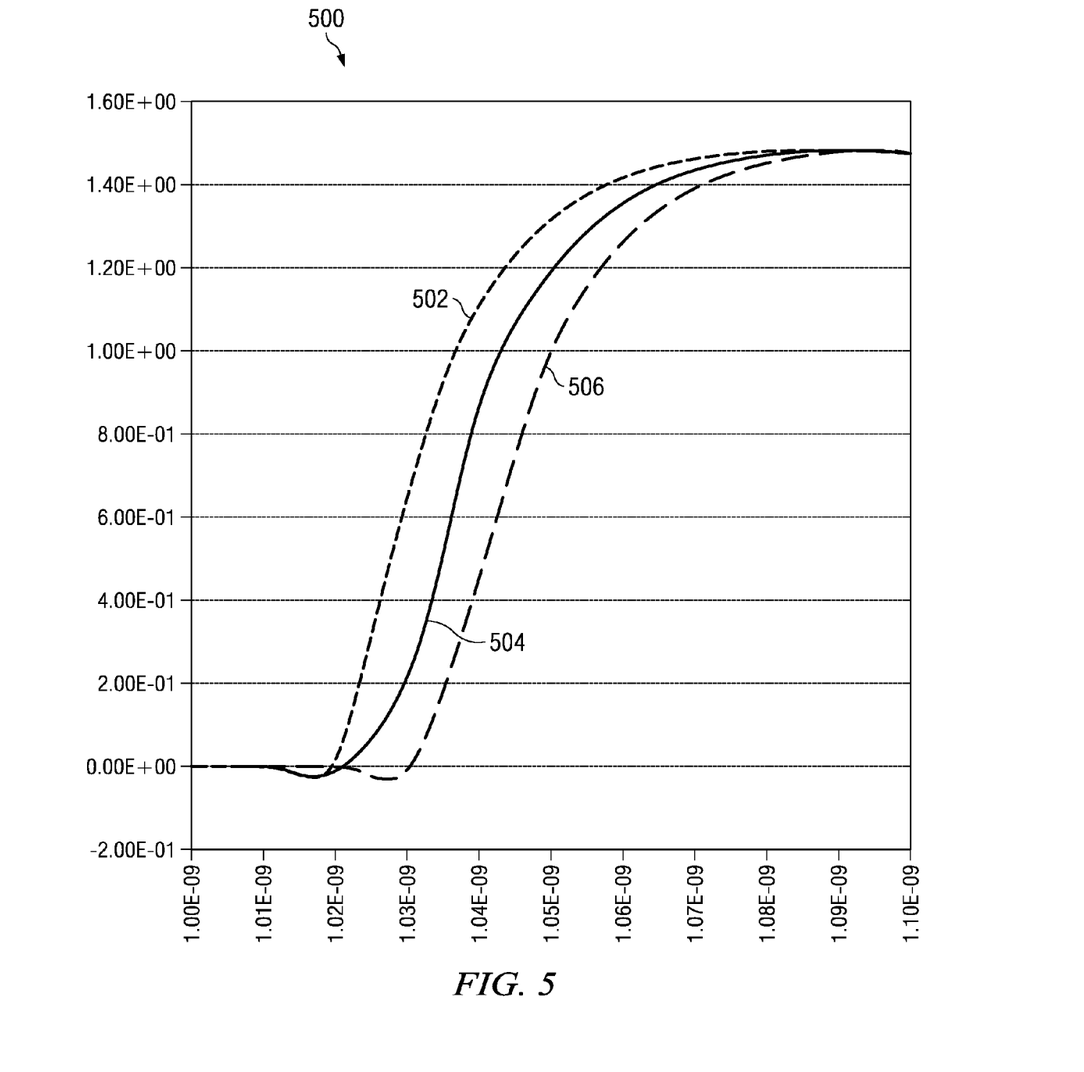
FIG. 5 illustrates a waveform chart showing gate and drain voltage waveforms of on a transistor device.
Figure 6:
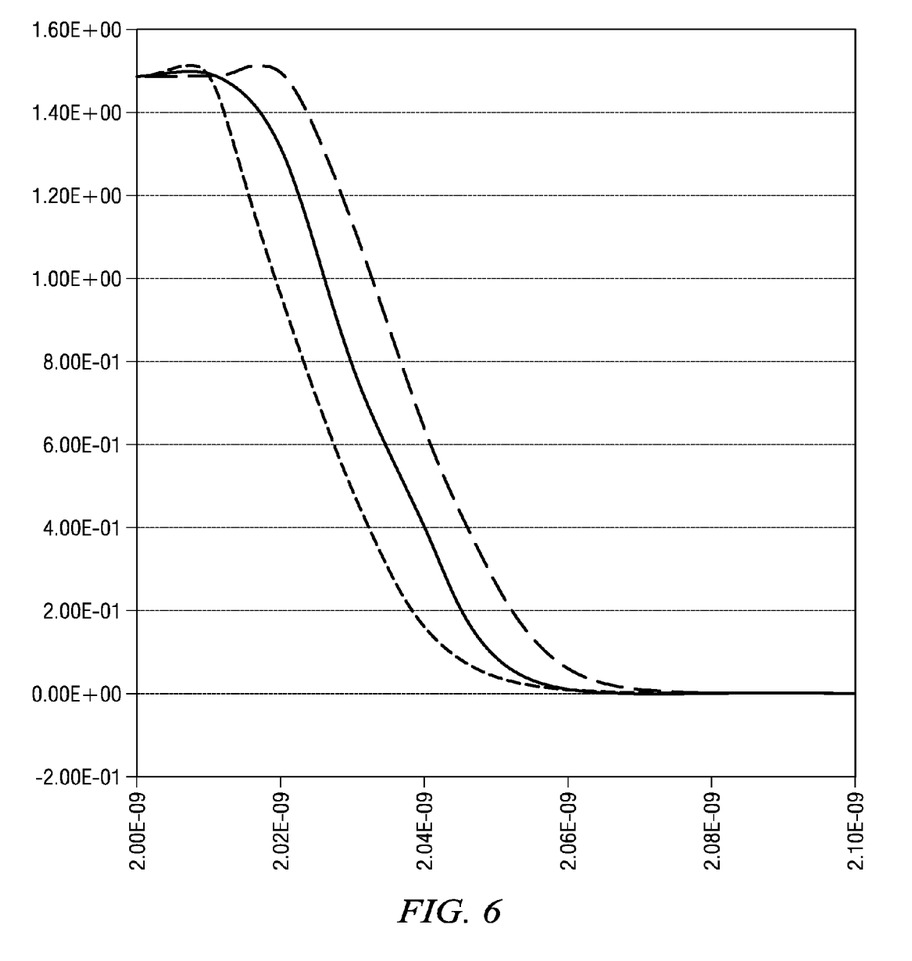
FIG. 6 illustrates a waveform chart showing gate and drain voltage waveforms of on a transistor device.

FIG. 5 illustrates a simulation model 500 of the rising edges of the signals provided at the gate terminal of transistor 324, for example. A waveform 502 is the rising edge of a delayed waveform generated at the gate of transistor device 324 in FIG. 3. Similarly, waveform 504 is a regular input waveform and 506 is the waveform advanced. FIG. 6 represents the falling edges of the same waveforms as shown in FIG. 5.

Figure 7:
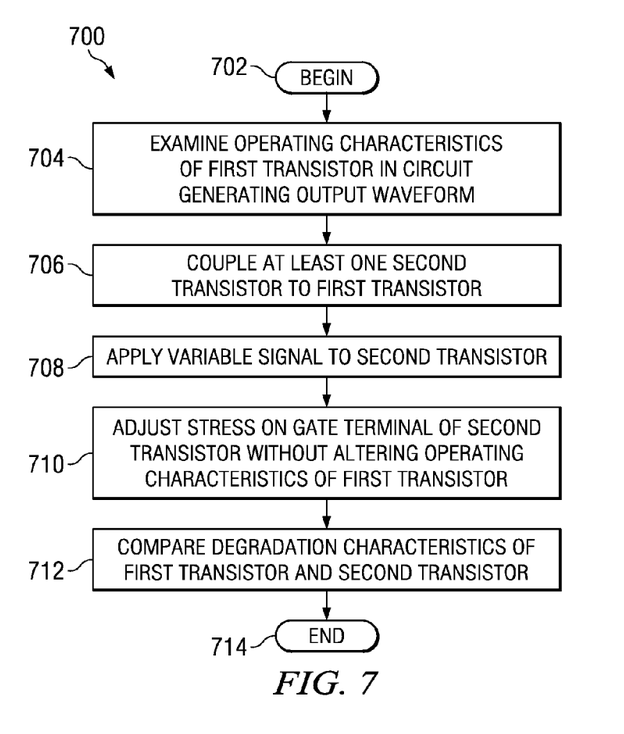
FIG. 7 illustrates a method of the present disclosure.

Referring now to FIG. 7, illustrates a method 700 to evaluate optimum power transistor switching characteristics for determining reliability limitations. Although the method 700 and other methods herein are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

The exemplary method 700 is described hereinafter in the context of a power amplifier circuit for generating varying input to output waveforms on an RF power amplifier. The method initializes at 702. At 704 operating characteristics of a first transistor are examined in a circuit generating an output waveform. The operating characteristics can comprise stress effects on the gate to drain terminals of the transistor, for example drain current and/or gate voltage. This provides a reference for comparison to measure degradation within the transistor device.

At 706, at least one second transistor can be coupled to the first transistor. In one embodiment, at least one second transistor can be coupled to the first transistor in a parallel configuration, wherein a gate terminal of the second transistor and first transistor are coupled in series. In one embodiment, the first transistor comprises a channel width that can be at least about one hundred times larger than a channel width of the first transistor, which generates a lot more driving current. Because the channel width of the second transistor is 100 times smaller than that of the first transistor, the second width does not significantly impact any output waveform generated by the circuit and/or alter any resonance frequency generated by the overall circuit. In one embodiment, a channel length of the first transistor can be about equal to that of the second transistor. In another embodiment, the second transistor may comprise a plurality of transistors coupled to the first transistor.

At 708 a variable signal is applied to the second transistor, for example, at a gate terminal for driving the device. The signal can be variable in phase or timing to delay or advance the signal and simulate timing offsets.

At 710 the method 700 further comprises adjusting a stress to the gate terminal of the second transistor independent of the first transistor without significantly altering any operating characteristics of the first transistor. The stress can comprise an increasing or decreasing in amplitude and/or frequency of the variable signal applied to the gate terminal of the transistor device. In one embodiment, adjusting the stress comprises increasing or decreasing a timing or phase of the variable signal. The stress (e.g., stress voltage) can be generated by a variable amplitude variable frequency signal generator coupled to a gate of the respective transistor gate terminal. The first transistor and the second transistor can be coupled to a separate variable amplitude variable frequency signal generator or both can be coupled to the same generator.

At 712, degradation behavior or characteristics are compared between the first transistor and the second transistor in order to examine how small Vg (gate voltage)/Vd (drain voltage) timing offset changes affect overall degradation of the devices. Reliability variations can then be determined as a function of the gate to drain voltages (Vg/Vd).

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method to evaluate optimum power amplifier switching characteristics for determining reliability limitations, the method comprising:
    examining operating characteristics of a first transistor in a circuit by applying a variable signal to a gate terminal of the first transistor and generating an output waveform;
    coupling at least one second transistor comprising a gate terminal to the first transistor;
    applying the variable signal to the gate terminal of the second transistor;
    adjusting a parameter of the variable signal applied to the gate terminal of the second transistor independently of application of the variable signal to the gate terminal of the first transistor thereby altering a drain voltage characteristic of the first transistor independent of a gate voltage operating characteristic of the first transistor.

2. The method of claim 1, further comprising comparing degradation characteristics of the first transistor and the second transistor based on measurements made with the parameter adjustment; and determining reliability variation as a function of gate to drain voltages.

3. The method of claim 1, wherein the second transistor has a channel width significantly smaller than a corresponding channel width of the first transistor so that adjusting the parameter of the variable signal applied to the gate terminal of the second transistor negligibly impacts the output waveform of the circuit.

4. The method of claim 3, wherein the first transistor channel width is at least about 100 times larger than the second transistor channel width.

5. The method of claim 3, wherein a channel length of the first transistor and a channel length of the second transistor are approximately equal.

6. The method of claim 1, wherein the second transistor is coupled to the first transistor in a parallel configuration.

7. The method of claim 1, wherein adjusting the parameter of the variable signal applied to the second transistor comprises increasing or decreasing a timing or phase of the variable signal.

8. The method of claim 1, wherein applying the variable signal to the second transistor comprises generating a signal using a first variable amplitude variable frequency signal generator coupled to the gate terminal of the second transistor, and wherein applying the variable signal to the first transistor comprises generating a signal using a second variable amplitude variable frequency signal generator.

9. A method for accelerated stress testing of an RF power amplifier transistor device, comprising:
applying a varying voltage input signal at a frequency to a gate of a first transistor under test and to a gate of a second transistor connected in parallel with the first transistor and having a channel width-to-length ratio on the order of 100× smaller than the first transistor;
varying the phase or timing of the input signal applied to the second transistor without varying the phase or timing of the input signal applied to the first transistor, thereby adjusting the gate and drain stress independently;
measuring drain current and gate voltage characteristics of the first and second transistors; and
determining a relationship between gate voltage and drain voltage timing offset changes from the measurements.

10. The method of claim 9, wherein applying the input signal to the gate of the first transistor comprises applying an oscillator signal to switch a first inverter to apply a DC bias.

11. The method of claim 10, wherein applying the input signal to the gate of the second transistor comprises applying the oscillator signal to switch a second inverter to apply the DC bias.

12. The method of claim 11, wherein varying the phase comprises adjusting switching the second inverter independently of switching the first inverter.

13. The method of claim 12, wherein the adjusting comprises delaying or advancing a signal parameter relative to an output of the first transistor.

14. The method of claim 13, wherein the second transistor has a same channel length as the first transistor.

15. The method of claim 14, further comprising providing an LC circuit connected to a drain of the first transistor for setting operation of the first transistor to a resonant frequency of the LC circuit.

* * * * *